United States Patent [19]
Park et al.

[11] Patent Number: 5,877,040
[45] Date of Patent: Mar. 2, 1999

[54] METHOD OF MAKING CHARGE-COUPLED DEVICE WITH MICROLENS

[75] Inventors: Chul Ho Park, Chungcheongbuk-do; Kwang Bok Song, Seoul, both of Rep. of Korea

[73] Assignee: LG Semicon Co., Ltd., Chungcheongbuk-do, Rep. of Korea

[21] Appl. No.: 852,562

[22] Filed: May 7, 1997

Related U.S. Application Data

[62] Division of Ser. No. 513,568, Aug. 10, 1995, Pat. No. 5,693,967.

[51] Int. Cl.$^6$ ............................................. H01L 21/339
[52] U.S. Cl. ........................................ 438/70; 438/79
[58] Field of Search ............................... 438/60, 69, 70, 438/71, 75, 78, 79, 144

[56] References Cited

U.S. PATENT DOCUMENTS

| | | | |
|---|---|---|---|
| 4,694,185 | 9/1987 | Weiss | 257/432 |
| 5,118,924 | 6/1992 | Mehra et al. | 257/222 |
| 5,306,926 | 4/1994 | Yonemoto | 257/233 |
| 5,312,779 | 5/1994 | Nelson | 438/70 |
| 5,371,397 | 12/1994 | Maegawa et al. | 257/432 |
| 5,479,049 | 12/1995 | Aoki et al. | 257/233 |
| 5,514,888 | 5/1996 | Sano et al. | 257/233 |
| 5,583,354 | 12/1996 | Ishibe | 257/233 |
| 5,672,519 | 9/1997 | Song et al. | 438/70 |
| 5,677,200 | 10/1997 | Park et al. | 438/70 |

*Primary Examiner*—Chandra Chaudhari

[57] ABSTRACT

A CCD and manufacturing method thereof is disclosed including: a first conductivity-type substrate having a convex portion; a first conductivity-type charge transmission domain formed on the substrate excluding the convex portion; a light detecting domain formed on the convex portion of the substrate and having a convex top surface; a second conductivity-type high-concentration impurity area formed on the top surface of the light detecting domain; a gate insulating layer formed on the substrate excluding the light detecting domain; a transmission gate formed on the gate insulating layer; a planarization layer formed on the substrate including the transmission gate; and a microlens formed on the planarization layer above a photodiode.

4 Claims, 6 Drawing Sheets

F I G.3H
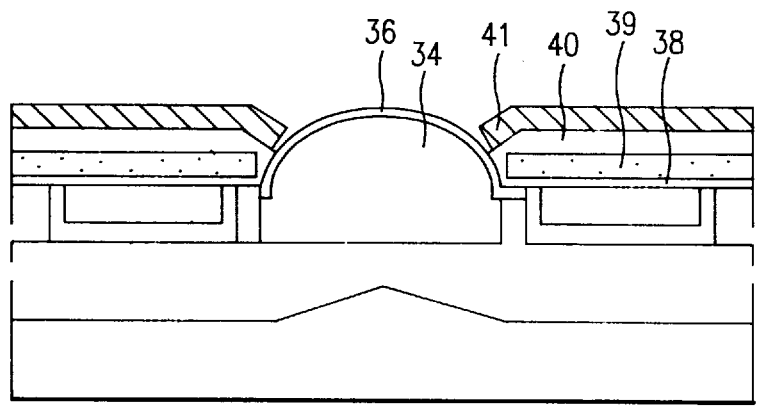
F I G.3I
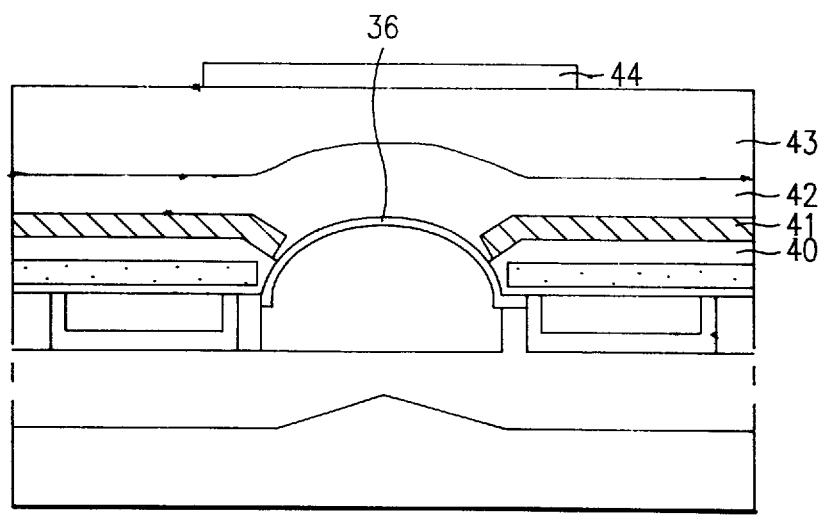

METHOD OF MAKING CHARGE-COUPLED DEVICE WITH MICROLENS

This application is a divisional of application Ser. No. 08/513,568, now U.S. Pat. No. 5,693,767 filed on Aug. 10, 1995, the entire contents of which are hereby incorporated by reference.

BACKGROUND OF THE INVENTION

The present invention relates to a charge-coupled device (CCD), and more particularly, to a CCD and method of manufacturing the same which prevents smear and improves sensitivity.

FIGS. 1A and 1B are sectional views of a conventional CCD. Referring to FIG. 1A, in the conventional CCD first and second p⁻ type wells 11 and 12 are formed on an n type substrate 10. An n⁺ type photodiode 14 and n⁺ type vertical charge coupled device (VCCD) 15, which is the charge transmission domain, are formed on first and second p⁻ type wells 11 and 12. A p⁺⁺ type surface isolation layer 16 is formed on n⁺ type photodiode 14. A third p⁻ type well 13 is formed to surround n⁺ type VCCD 15. A p⁺ type channel stop 17 is formed to insulate pixels therebetween.

A gate insulator 18 is formed on the overall surface of the substrate. A transmission gate 19, interlevel insulator 20 and light-shielding layer 21 are formed sequentially on gate insulator 18 above VCCD 15. A passivation layer 22 is formed on the overall surface of the substrate.

A first planarization layer 23 is formed on passivation layer 22. A color filter layer 24 is formed on first planarization layer 23 above photodiode 14. A second planarization layer 25 is formed on first planarization layer 23 including color filter layer 24. A microlens 26 is formed on second planarization layer 25 above color filter layer 24.

In the conventional CCD, light coming through a camera lens is converged by microlens 26 and passes through color filter layer 24. Light selectively passing through color filter layer 24 is incident upon photodiode 14, and photoelectrically converted into charges. These charges produced from the photodiode through photoelectric conversion are transmitted to VCCD 15 and then vertically to a horizontal charge coupled device (HCCD) by a clock signal of VCCD 15. The charges transmitted to the HCCD (not shown) are horizontally transmitted by a clock signal of the HCCD. The horizontally transmitted charges are detected as a voltage due to the device ends' floating diffusion. The voltage is amplified to be transmitted to the peripheral circuits.

As shown in FIG. 1B, in the conventional CCD, light incident upon the center of the microlens comes into photodiode 14 to be photoelectrically converted into signal charges. However, light incident on the periphery of the microlens enters VCCD 15 and is photoelectrically converted into smear charges. These smear charges cause the smear phenomenon. In case of long-wavelength light, the light incident on microlens 26 passes through the photodiode and enters first p⁻ type well 11, producing undesirable signal charges. In addition, the step height in the photodiode and VCCD becomes high.

SUMMARY OF THE INVENTION

Therefore, it is an object of the present invention to provide a CCD and manufacturing method thereof in which the photodiode is formed like the microlens, to thereby enhance photosensitivity.

It is another object of the present invention to provide a CCD and manufacturing method thereof in which light converged by the microlens is focused only on the photodiode, to thereby prevent the smear.

To accomplish the objects of the present invention, there is provided a CCD comprising: a first conductivity-type substrate having a convex portion; a first conductivity-type charge transmission domain formed on the substrate excluding the convex portion; a light detecting domain formed on the convex portion of the substrate and having a convex top surface; a second conductivity-type high-concentration impurity area formed on the top surface of the light detecting domain; a gate insulating layer formed on the substrate excluding the light detecting domain; a transmission gate formed on the gate insulating layer; a planarization layer formed on the substrate including the transmission gate; and a microlens formed on the planarization layer above a photodiode.

For the present invention, there is provided a method of manufacturing a CCD comprising the steps of: etching a first conductivity-type substrate to thereby form a convex portion; ion-implanting a first conductivity-type impurity into the substrate excluding the convex portion to thereby form a first conductivity-type charge transmission domain; sequentially forming a gate insulating layer and transmission gate on the substrate above the charge transmission domain; ion-implanting a first conductivity-type impurity into the convex portion of the substrate, using the transmission gate as a mask, to thereby form a convex light detecting area; ion-implanting a second conductivity-type high-concentration impurity into the light detecting area to thereby form a second conductivity-type high-concentration impurity area on the surface of the light detecting area; forming a planarization layer over the substrate; and forming a microlens on the planarization layer above a photodiode.

BRIEF DESCRIPTION OF THE ATTACHED DRAWINGS

FIGS. 3A–3J show the manufacturing sequence of the charge-coupled device of the present invention shown in FIGS. 2A and 2B.

DETAILED DESCRIPTION OF THE INVENTION

Hereinafter, a preferred embodiment of the present invention will be described with reference to the attached drawings.

Figure 2A:
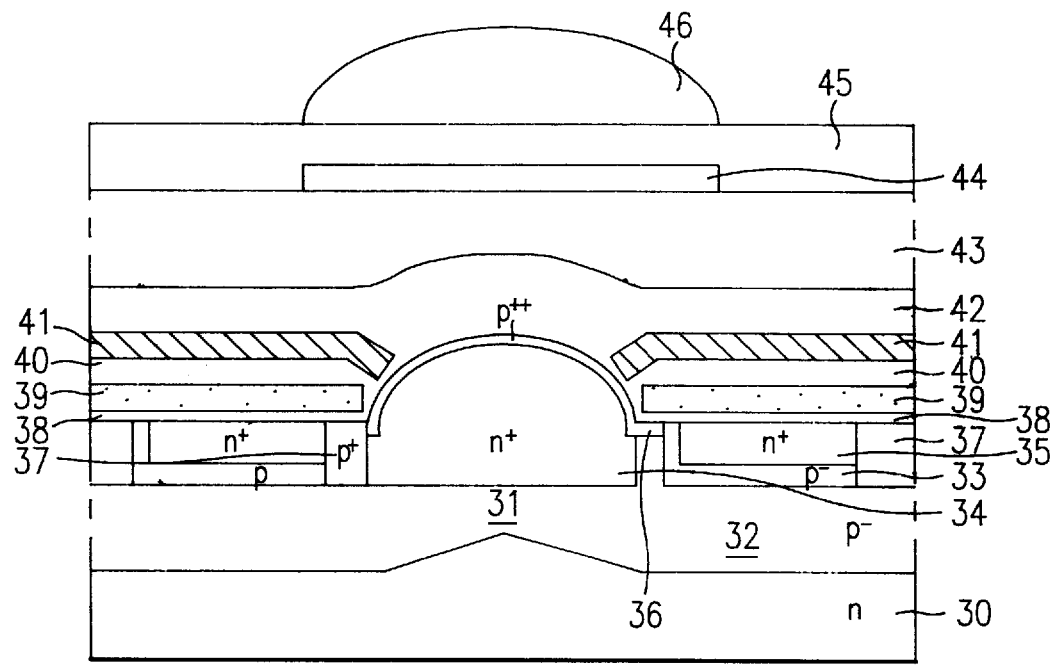
FIGS. 2A and 2B are sectional views of one embodiment of the charge-coupled device of the present invention.

Referring to FIG. 2A, first and second p⁻ type wells 31 and 32 are formed on an n type substrate 30. A convex photodiode 34 is formed on first p⁻ type well 31. A VCCD 35, a charge transmission domain, is formed on second p⁻ type well 32.

A p⁺⁺ type surface isolation layer 37 is formed on the convex surface of photodiode 34. A gate insulating layer 38, transmission gate 39 and light-shielding layer 41 are formed on the substrate excluding the convex surface of the photodiode. An interlevel insulating layer 40 is formed between transmission gate 39 and light-shielding layer 41.

A passivation layer 42 is formed on the overall surface of the substrate. A first planarization layer 43 is formed on passivation layer 42. A color filter layer 44 is formed on first planarization layer 43 above the photodiode. A second planarization layer 45 is formed on first planarization layer 43 including color filter layer 44. A microlens 46 is formed on second planarization layer 45 above the color filter layer.

Figure 1A:
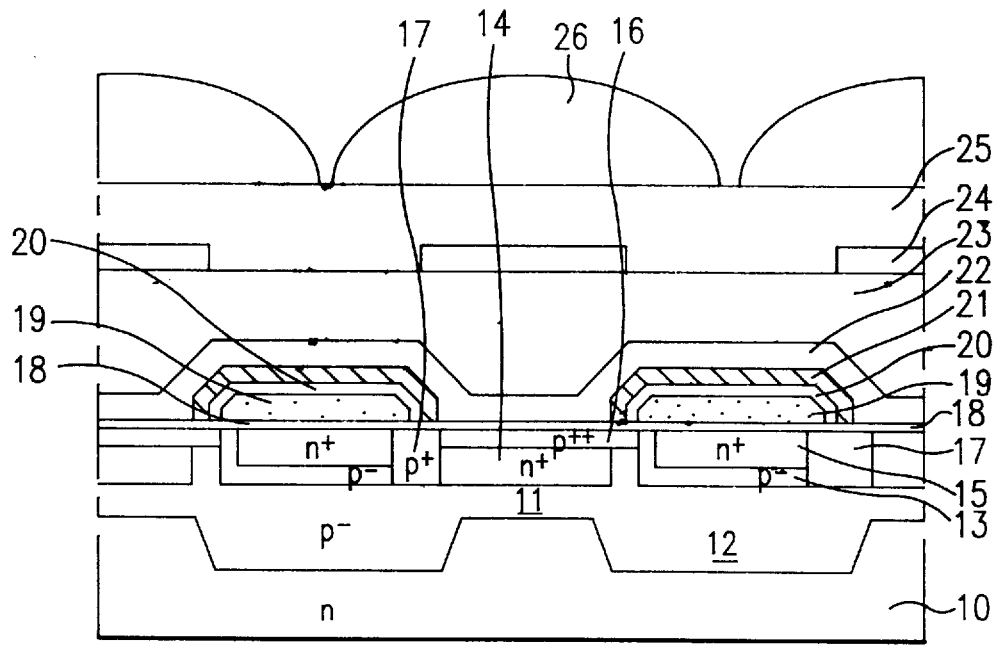
FIGS. 1A and 1B are sectional views of a conventional charge-coupled device.
Figure 1B:
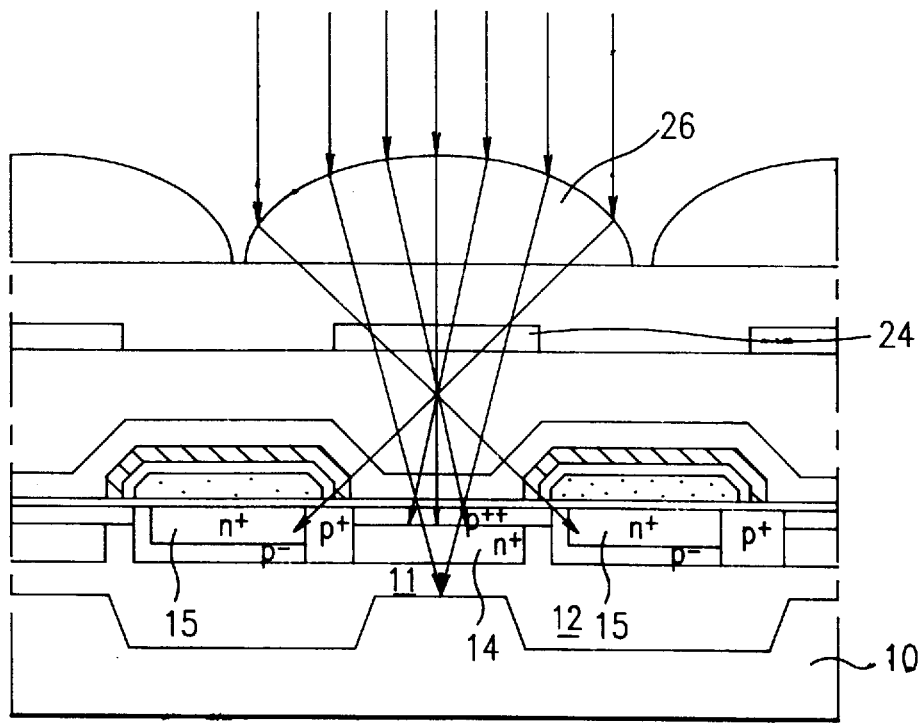

In the CCD of the present invention, photodiode 34 has a convex top surface to be formed like microlens 46, increasing the light receiving area as compared with the photodiode of the conventional CCD shown in FIGS. 1A and 1B.

Figure 2B:
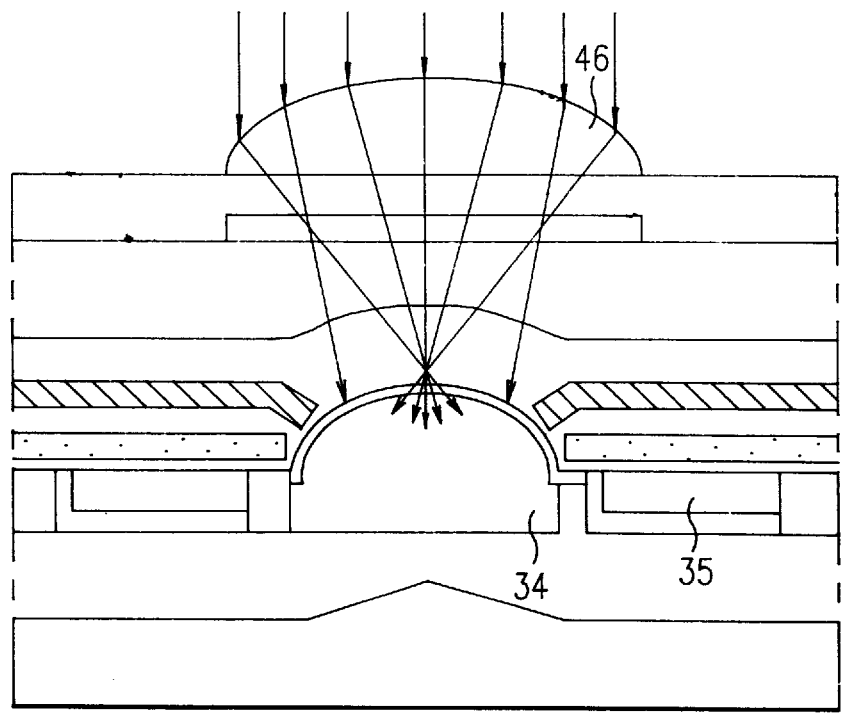

In addition, the distance between the microlens and photodiode is shortened because the photodiode is convex. For this reason, as shown in FIG. 2B, the light converged by microlens 46 is focused only on photodiode 34 and long-wavelength light is incident only upon the photodiode, preventing the smear. Furthermore, the convex top surface of the photodiode improves the step height in the photodiode and VCCD, facilitating the succeeding process.

Figure 3A:
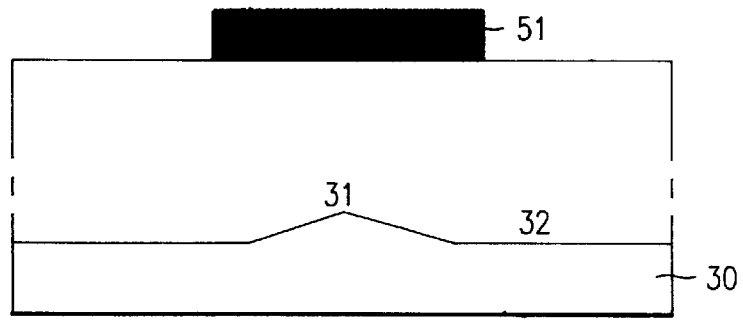

Now, referring to FIG. 3A, first and second p⁻ type wells 31 and 32 are sequentially formed on n type substrate 30. A material 51 for the microlens is coated and patterned on the overall surface of the substrate. The material for the microlens is left only on the substrate above first p⁻ type well 31. Here, first p⁻ type well 31 is formed by first ion implanting a p⁻ type impurity into substrate 30. Second p⁻ type well 32 is formed by second ion implanting a p⁻ type impurity into substrate 30 excluding first p⁻ type well 31. Second p⁻ type well 32 has a junction depth deeper than that of first p⁻ type well 31.

Figure 3B:
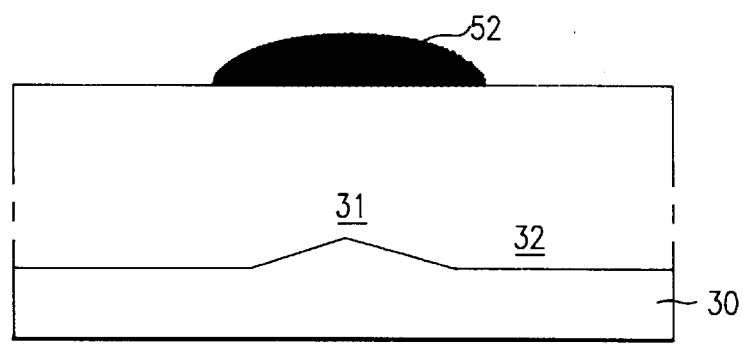
Figure 3C:
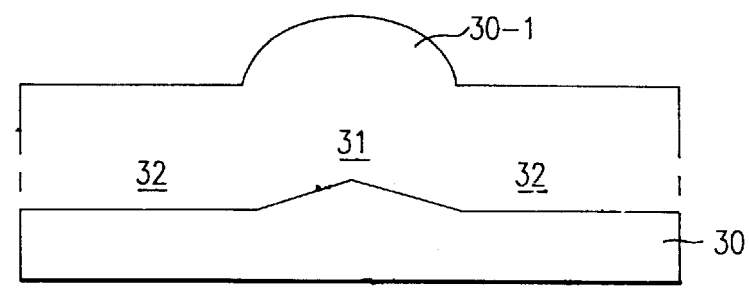

When microlens material 51 flows thermally at 100°–200° C., microlens 51 is formed on the substrate above first p⁻ type well 31, as shown in FIG. 3B. When the substrate in which microlens 52 is formed is dry-etched to etch all of microlens 52, the substrate has a convex portion 30-1, as shown in FIG. 3C. Here, the photodiode will be formed in convex portion 30-1 according to the succeeding process.

Figure 3D:
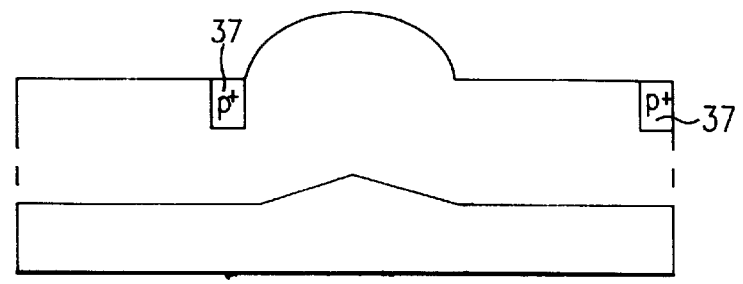
Figure 3E:
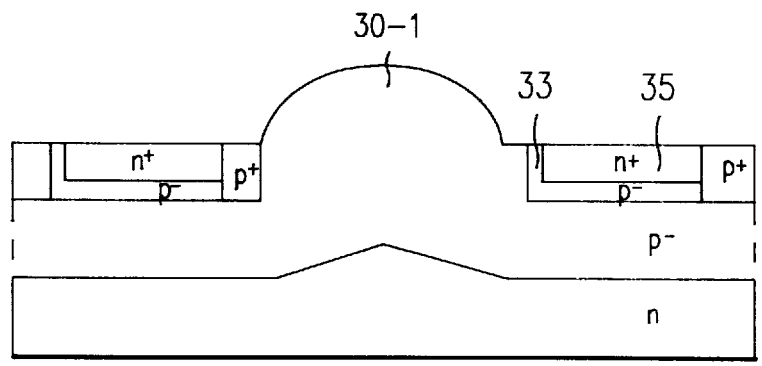

Referring to FIG. 3D, p⁺ type channel stop 37 is formed to insulate pixels therebetween. Subsequently, as shown in FIG. 3E, p⁺ type impurity and n⁺ type impurity are ion-implanted into substrate 30 excluding convex portion 30-1, to thereby form third p⁻ type well 33 and n⁺ type VCCD 35.

Figure 3F:
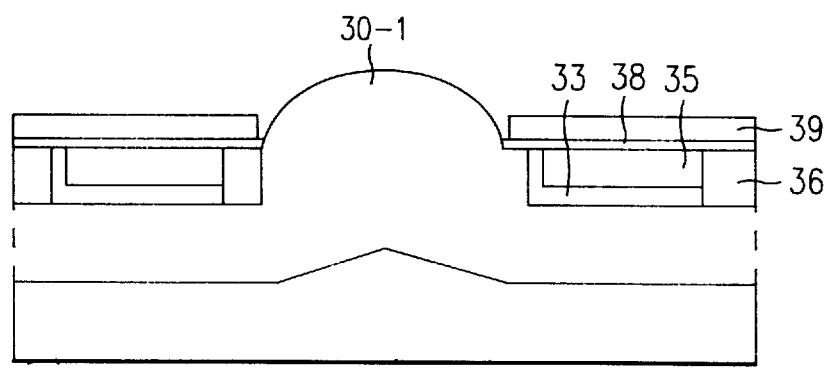

As shown in FIG. 3F, gate insulator 38 of oxide layer and nitride layer is formed on the substrate excluding convex portion 30-1. Then, a polysilicon layer is deposited and patterned on the overall surface of the substrate, to thereby form transmission gate 39 on gate insulator 38.

Figure 3G:
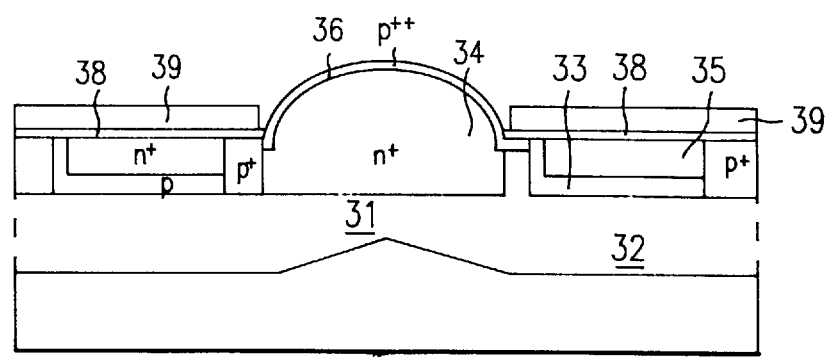
Figure 3J:
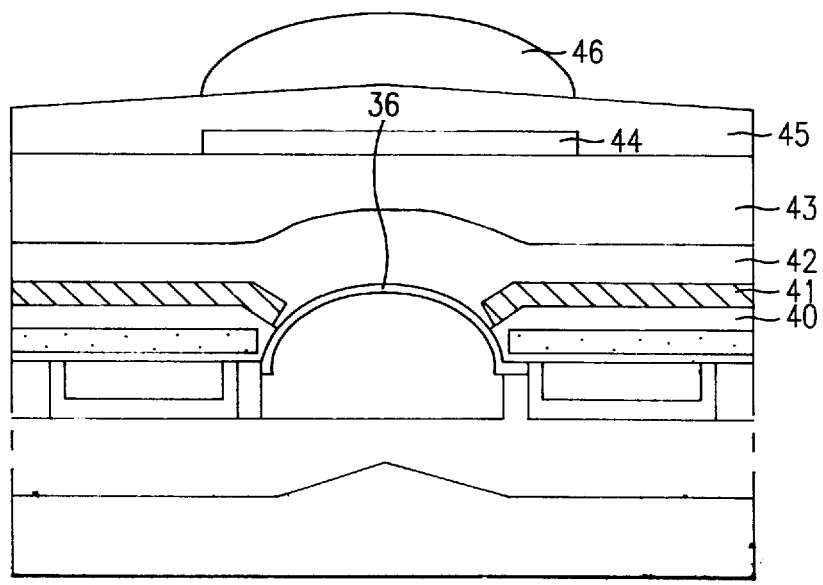

In FIG. 3G, using transmission gate 39 as a mask, n⁺ type impurity is ion-implanted into convex portion 30-1 of the substrate to thereby form n⁺⁺ type photodiode 34. Using transmission gate 39 as a mask, p⁺⁺ type impurity is ion-implanted into photodiode 34 to thereby form p⁺⁺ type surface isolation layer 36 on the surface of photodiode 34.

Subsequently, referring to FIG. 3H, interlevel insulating layer 40 is formed on transmission gate 39 excluding the convex top surface of photodiode 34. The overall surface of the substrate is coated of a metal layer and patterned to thereby form light-shielding layer 41 on insulating layer 40.

As shown in FIG. 3H, a nitride layer is deposited on the overall surface of the substrate to form passivation layer 42. First planarization layer 43 is formed thereon. Color filter layer 44 is formed on first planarization layer 43 above photodiode 34.

Second planarization layer 45 is formed on first planarization layer 43 including color filter layer 44. Finally, through a general process of forming a microlens, microlens 46 is formed on second planarization layer 45 above color filter layer 44, finishing manufacturing the CCD of the present invention.

As described above, the present invention has the following effects.

First, the light receiving area of the photodiode is increased as compared with the conventional CCD because the photodiode is formed like the microlens. This improves photosensitivity.

Second, the step height of the photodiode and VCCD is improved to facilitate succeeding processes.

Third, the photodiode is formed convex to shorten the distance between the microlens and photodiode, as compared with the conventional CCD. Therefore, light converged by the microlens including the long-wavelength light all is incident only upon the photodiode, completely suppressing the smear.

What is claimed is:

1. A method of manufacturing a CCD comprising the steps of:

etching a first conductivity-type substrate to thereby form a convex portion;

ion-implanting a first conductivity-type impurity into said substrate excluding said convex portion to thereby form a first conductivity-type charge transmission domain;

sequentially forming a gate insulating layer and transmission gate on said substrate above said charge transmission domain;

ion-implanting a first conductivity-type impurity into said convex portion of said substrate, using said transmission gate as a mask, to thereby form a convex light detecting area;

ion-implanting a second conductivity-type high-concentration impurity into said light detecting area to thereby form a second conductivity-type high-concentration impurity area on the surface of said light detecting area;

forming a planarization layer over said substrate; and forming a microlens on said planarization layer above a photodiode.

2. A method of manufacturing a CCD as claimed in claim 1, wherein said step of forming said convex portion on said substrate comprises the substeps of:

coating a microlens material on said substrate;

patterning said microlens material to be left only on a portion corresponding to said light detecting area;

thermally flowing said microlens material to thereby form said microlens on said substrate;

dry-etching said substrate to thereby remove said microlens and simultaneously form a convex portion on a portion where said microlens is removed.

3. A method of manufacturing a CCD as claimed in claim 1, after the step of forming said transmission gate, further comprising a step of forming a light-shielding layer on said substrate excluding said light detecting area.

4. A method of manufacturing a CCD as claimed in claim 1, after the step of forming said planarization layer, further comprising a step of forming a color filter layer on said planarization layer above said light detecting area.

* * * * *

UNITED STATES PATENT AND TRADEMARK OFFICE
CERTIFICATE OF CORRECTION

PATENT NO. : 5,877,040
APPLICATION NO. : 08/852562
DATED : March 2, 1999
INVENTOR(S) : Chul Ho Park et al.

It is certified that error appears in the above-identified patent and that said Letters Patent is hereby corrected as shown below:

Column 1, line 5, of the patent, the patent number which is set forth as "5,693,767" should read -- 5,693,967 --.
As such, the complete line should read as follows:

08/513,568 now U.S. Pat. No. 5,693,967 filed on Aug. 10,

Signed and Sealed this

Twenty-eighth Day of July, 2009

JOHN DOLL
*Acting Director of the United States Patent and Trademark Office*